United States Patent
Sultenfuss et al.

(10) Patent No.: US 10,824,209 B2
(45) Date of Patent: Nov. 3, 2020

(54) INFORMATION HANDLING SYSTEM WITH HIGH CURRENT BATTERY PLANAR TAB INTERCONNECT

(71) Applicant: DELL PRODUCTS, LP, Round Rock, TX (US)

(72) Inventors: Andrew T. Sultenfuss, Leander, TX (US); Rick C. Thompson, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 197 days.

(21) Appl. No.: 15/974,249

(22) Filed: May 8, 2018

(65) Prior Publication Data
US 2019/0346891 A1 Nov. 14, 2019

(51) Int. Cl.
G06F 1/18 (2006.01)
H05K 1/18 (2006.01)
H05K 3/32 (2006.01)
H01M 2/26 (2006.01)
H01R 11/28 (2006.01)

(52) U.S. Cl.
CPC .............. *G06F 1/189* (2013.01); *H01M 2/26* (2013.01); *H01R 11/289* (2013.01); *H05K 1/18* (2013.01); *H05K 3/328* (2013.01); *H05K 2201/10037* (2013.01); *H05K 2201/10287* (2013.01)

(58) Field of Classification Search
CPC .......... G06F 1/189; H05K 1/18; H05K 3/328; H05K 2201/10037; H05K 2201/10287; H01M 2/26; H01R 11/289
See application file for complete search history.

(56) References Cited

U.S. PATENT DOCUMENTS

| | | | |
|---|---|---|---|
| 8,399,117 B2 | 3/2013 | Hu et al. | |
| 2003/0121142 A1* | 7/2003 | Kikuchi | B23K 11/11 29/623.4 |
| 2004/0234848 A1* | 11/2004 | Chung | H01M 2/021 429/181 |
| 2010/0323237 A1 | 12/2010 | Huang et al. | |

* cited by examiner

*Primary Examiner* — Gregg Cantelmo
(74) *Attorney, Agent, or Firm* — Larson Newman, LLP

(57) ABSTRACT

A battery cell includes a first power tab and a first conducting wire. The first power tab may include a proximal end connected to the battery cell, and may provide a first output terminal for the battery cell. The first conducting wire may be connected to a distal end of the first power tab, and may be encircled by the first power tab. The first conducting wire may connect with a power circuit board to provide power from the battery cell.

5 Claims, 6 Drawing Sheets

INFORMATION HANDLING SYSTEM WITH HIGH CURRENT BATTERY PLANAR TAB INTERCONNECT

FIELD OF THE DISCLOSURE

The present disclosure generally relates to information handling systems, and more particularly relates to an information handling system with high current battery cell planar tab interconnect.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A battery cell includes a first power tab and a first conducting wire. The first power tab may include a proximal end connected to the battery cell, and may provide a first output terminal for the battery cell. The first conducting wire may be connected to a distal end of the first power tab, and may be encircled by the first power tab. The first conducting wire may connect with an information handling system to provide power from the battery cell to a power circuit board.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
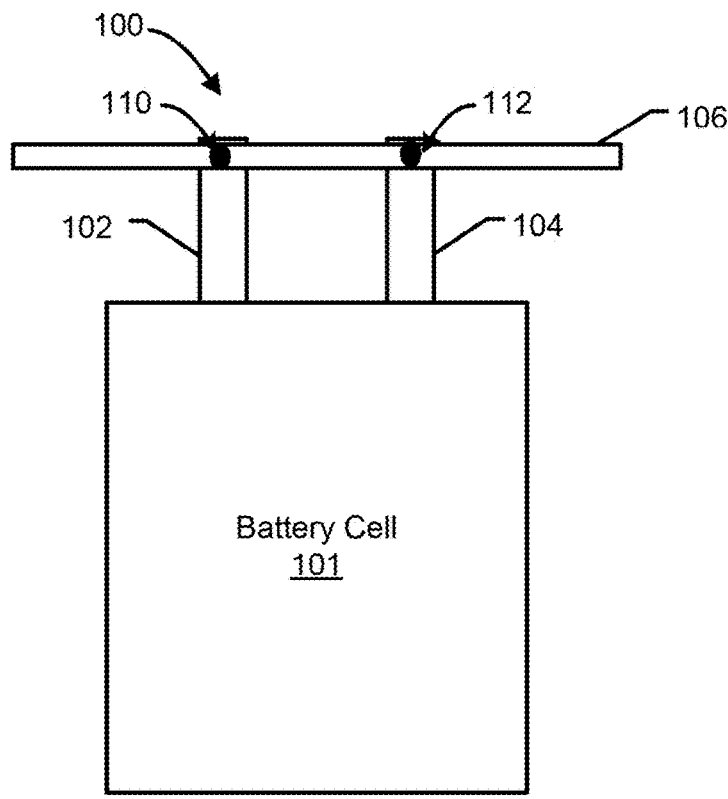
FIGS. 1-4 are diagrams of a battery cell in different stages of forming an interconnect according to at least one embodiment of the disclosure.
Figure 2:
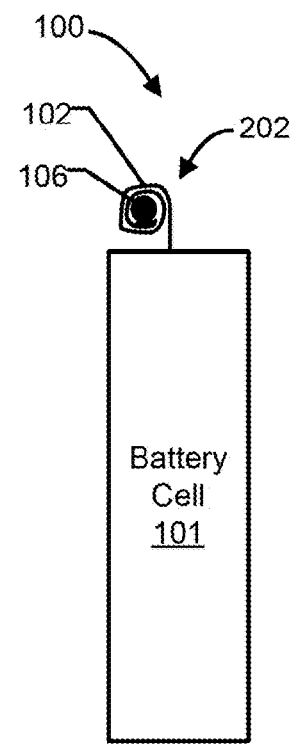
Figure 3:
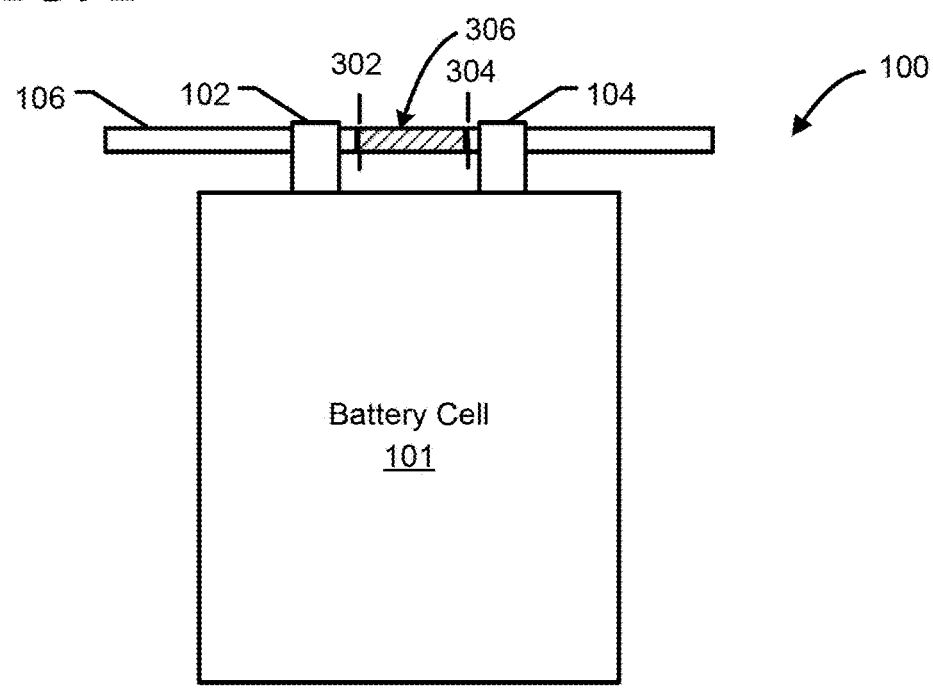
Figure 4:
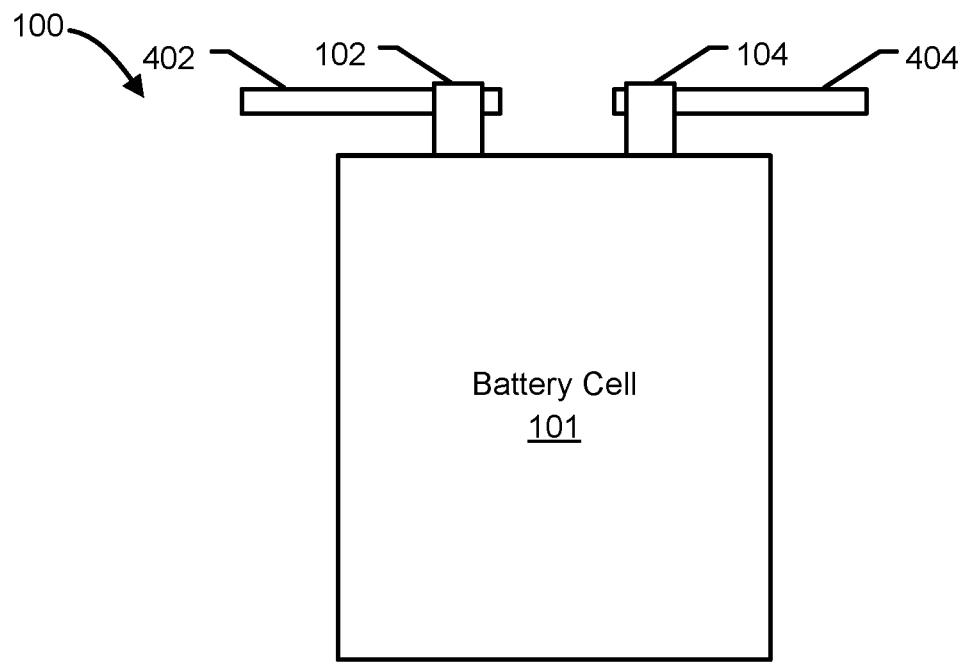
Figure 5:
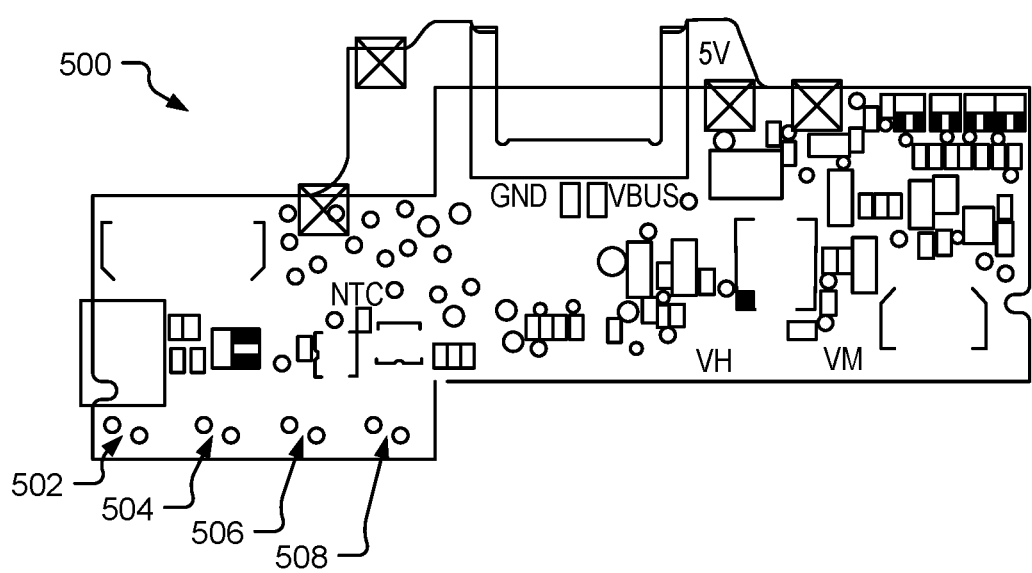
FIG. 5 is a diagram of a first embodiment of a power circuit board to connect the battery cell to an information handling system according to at least one embodiment of the disclosure.
Figure 6:
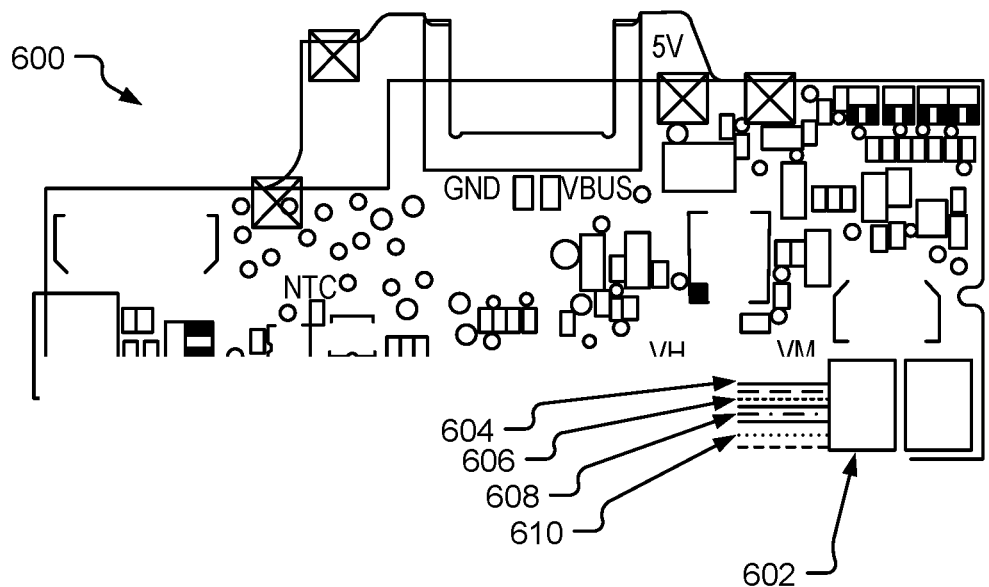
FIG. 6 is a diagram of a second embodiment of a power circuit board to connect the battery cell to the information handling system according to at least one embodiment of the present disclosure.

FIGS. 1-4 show a battery cell 101 for an information handling system 100 in different stages of forming an interconnect between the battery cell 101 and a power circuit board, such as power circuit board 500 of FIG. 5 or power circuit board 600 of FIG. 6, of the information handling system 100. An information handling system may operate in the capacity of a server or as a client user computer in a server-client user network environment, or as a peer computer system in a peer-to-peer (or distributed) network environment. The information handling system can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system can be implemented using electronic devices that provide voice, video or data communication. Further, while a single information handling system is illustrated, the term "system" shall also be taken to include any collection of systems or sub-systems that individually or jointly execute a set, or multiple sets, of instructions to perform one or more computer functions The battery cell 101 includes power tabs 102 and 104, which can be connected to power pads of a power circuit in an information handling system 100. In an embodiment, the battery cell 101 can be incorporated into a battery that includes one or more cells, such as two battery cells connected in series, three battery cells connected in series, four battery cells connected in series, two battery cells connected in parallel and two battery cells connected in series, X battery cells connected in parallel and Y battery cells connected in series, or the like. The power tabs 102 and 104 can each include a proximal end connected to the battery cell 101 and a distal end that is the end furthest from the battery cell 101. In previous information handling systems, the power tabs 102 and 104 would be spot welded to the power pads of the power circuit, and the size of the power tabs 102 and 104 would cause the power pads to consume a large amount of surface area on the power circuit in order to accommodate the power tabs 102 and 104. Therefore, an improved battery cell interconnect of battery cell 101 is described herein.

If the battery cell 101 has not yet been activated, a wire 106 can be placed in physical communication with the power tabs 102 and 104, such as with the distal ends of the power tabs 102 and 104. In an embodiment, the battery cell 101 is not active when connecting the power tabs 102 and 104 to a circuit, a wire, or the like does not cause a current flow between the power tabs 102 and 104. In an embodiment, the wire 106 can be a single strand wire or a multiple strand wire, and the gauge of the wire 106 can be selected based on a power circuit board connection for the wire 106. In an embodiment, the wire 106 can be more conductive than the power tabs 102 and 104. After the wire 106 is placed in physical communication with the power tabs 102 and 104, the wire 106 can be spot welded to power tab 102 at a location 110, and the wire 106 can be spot welded to power tab 104 at a location 112. In an embodiment, the power tabs 102 and 104 can be pliable, such that the power tabs 102 and 104 can be easily bent without breaking.

Upon the wire 106 being spot welded to the power tabs 102 and 104, the wire 106 can be rolled along the power tabs 102 and 104 from the distal ends to the proximal ends until the length of the power tabs 102 and 104 is substantially reduced. In an embodiment, the length of the power tabs 102 and 104 can be a distance that the power tabs 102 and 104 extend from the battery cell 101. When the wire 106 has been rolled along the power tabs 102 and 104, the power tabs 102 and 104 can be wrapped around the wire 106 as indicated by arrow 202 in FIG. 2. In an embodiment, the power tabs 102 and 104 can encircle the write 106 multiple times as shown by arrow 202.

Referring now to FIG. 3, a connection created by the wire 106 in between power tabs 102 and 104 can be broken by the wire 106 being cut along lines 302 and 304. The two cuts of wire 106, along lines 302 and 304, can result in a section 306 of the wire 106 being removed. In response to section 306 being removed the wire 106 can now be two separate wires 402 and 404 as shown in FIG. 4. After the separation of wire 106 into two wires 402 and 404, the battery cell 101 can be activated, such that power can be provided by the battery cell 101 via power tab 102 and wire 402 and via power tab 104 and wire 404.

In an embodiment, if the battery cell 101 is activated prior to the power tabs 102 and 104 being connected to a wire, the wire 402 can be connected to the distal end of power tabs 102 and the wire 404 can be connected to the distal end of power tab 104. After the wire 402 is placed in physical communication with the power tab 102, the wire 402 can be spot welded to power tab 102. Similarly, after the wire 404 is placed in physical communication with the power tab 104, the wire 404 can be spot welded to power tab 104. Upon the wire 402 being spot welded to the power tab 102, the wire 402 can be rolled along the power tab 102 from the distal end to the proximal end until the length of the power tab 102 is substantially reduced. Similarly, after the wire 404 is spot welded to the power tab 104, the wire 404 can be rolled along the power tab 104 from the distal end to the proximal end until the length of the power tab 104 is substantially reduced.

The wires 402 and 404 can then be connected to a power circuit board, such as power circuit board 500 of FIG. 5 or power circuit board 600 of FIG. 6. Referring now to FIG. 5, the power circuit board 500 can include multiple via pairs 502, 504, 506, and 508. In an embodiment, the wires 402 and 404 can be sized to the size of the opening of a single via of the via pairs 502, 504, 506, and 508. Thus, the wires 402 and 404 can be inserted in one of the via pairs, such as via pair 502. The via pair 502 can then route power from the battery cell 101 to different components of the power circuit board 500 and the rest of the information handling system 100. Each of the via pairs 502, 504, 506, and 508 can connect a different battery cell to the power circuit board 500, and an area of the power circuit board 500 consumed by the via pairs 502, 504, 506, and 508 can be substantially less than power pads needed if the power tabs 102 and 104 were directly connected to the power circuit board 500.

Referring now to FIG. 6, the power circuit board 600 can include a power interconnect 602 with a multiple power wire connection pairs 604, 606, 608, and 610. In an embodiment, the wires 402 and 404 can connect to one of the power wire connection pairs, such as power wire connection pair 604. The power interconnect 602 can then route power from the battery cell 101 to different components of the power circuit board 600 and the rest of the information handling system 100. Each of the power wire connection pairs 604, 606, 608, and 610 can connect a different battery cell to the power circuit board 600, and an area of the power circuit board 600 consumed by the power interconnect 602 can be substantially less than power pads needed if the power tabs 102 and 104 were directly connected to the power circuit board 600.

Figure 7:
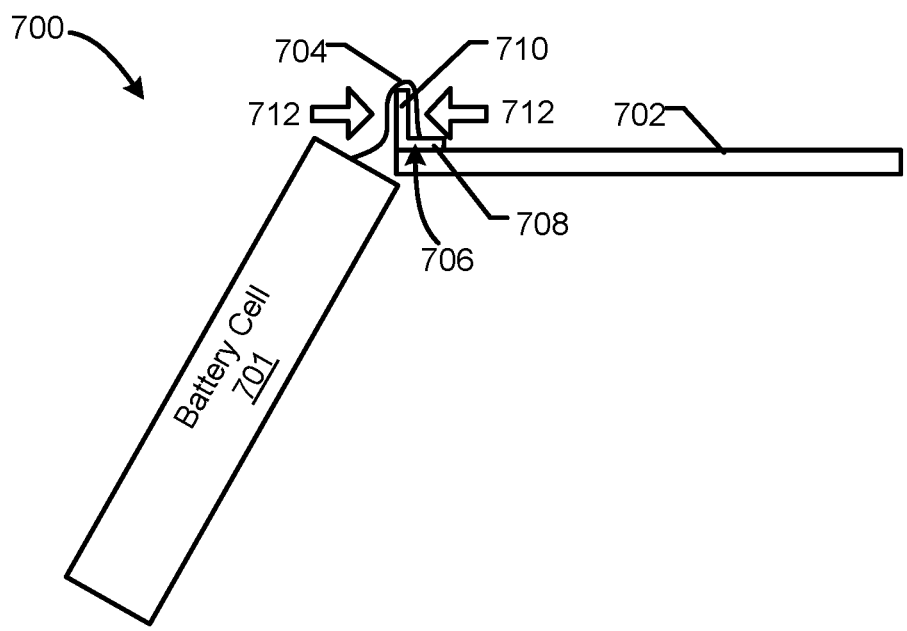
FIG. 7 is a diagram of the battery cell in a first connection stage to a vertical standoff of the power circuit board according to at least one embodiment of the present disclosure.

FIG. 7 illustrates a battery cell 701 and a power circuit board 702 of an information handling system 700 according to at least one embodiment of the present disclosure. The battery cell 701 includes two power tabs 704, as described above for battery cell 101 with respect to FIGS. 1-4, with a power tab 704 visible in FIG. 7. The power tabs 704 can each include a proximal end connected to the battery cell 701 and a distal end that is the end furthest from the battery cell 701. In an embodiment, the power tabs 704 can be pliable, such that the power tabs 704 can be easily bent without breaking. The power circuit board 702 includes a power standoff 706, which in turn includes a base 708 and an extension portion 710. While only a single power standoff 706 is illustrated in FIG. 7, the power circuit board 702 can include two power standoffs 706 each of which can connect to one of the power tabs 704 of the battery cell 701. However, for clarity and brevity connection between a single power tab 704 and a single power standoff 706 will be described herein with respect to FIGS. 7-9.

Figure 8:
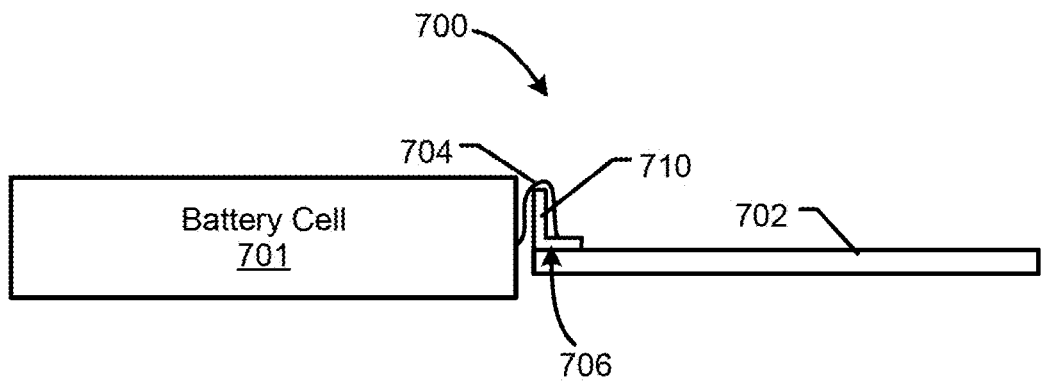
FIG. 8 is a diagram of the battery cell in a second connection stage to the vertical standoff of the power circuit board according to at least one embodiment of the present disclosure.
Figure 9:
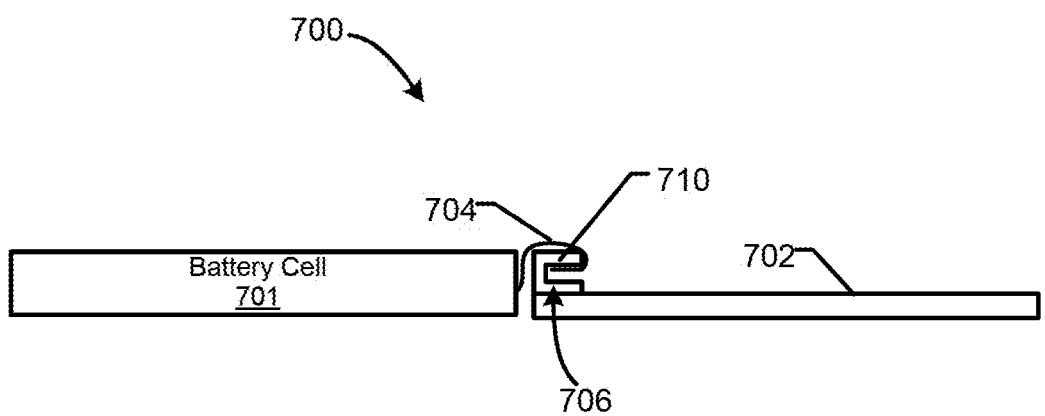
FIG. 9 is a diagram of the battery cell in a third connection stage to the vertical standoff of the power circuit board according to at least one embodiment of the present disclosure.

In an embodiment, the base 708 of the power standoff 706 can be substantially smaller in area of the power circuit board 702 consumed as compared to a power pad needed if the power tab 704 is connected directly to a power pad of the surface of the power circuitry 702. The base 708 can have a substantially smaller area than a previous power pad based on the power tab 704 being placed in physical communication with both sides of the extension portion 710, such that the power tab 704 can contact a proper surface area of the power standoff with a minimum amount of area of the power standoff 706 consuming space on the power circuit board 702. Upon the power tab 704 being placed in physical communication with both sides of the extension portion 710, the power tab 704 can be spot welded to the extension portion 710 as indicated by arrows 712. The battery cell 701 can then be aligned with the power circuit board 702 as shown in FIG. 8. In this alignment, the battery cell is thick enough that the extension portion 710 does not extend above the battery cell 701. However, if the battery cell 701 is a thin battery cell, as shown in FIG. 9, the extension portion 710 can be bent over to a height below that of the thin battery cell 701 of FIG. 9.

While FIGS. 1-9 illustrate a battery cell 101 or 701 utilizing a particular connection type, such as wire 106 or power standoff 706, one of ordinary skill in the art would recognize that these connection types do not need to be implemented separately. For example, a battery with more than one cell could utilize multiple different connection types for the cells, such as traditional power pad connections on the power circuit board, the wire 106 to connected to the power circuit board, a power standoff 706 on the power circuit board, or the like.

Figure 10:
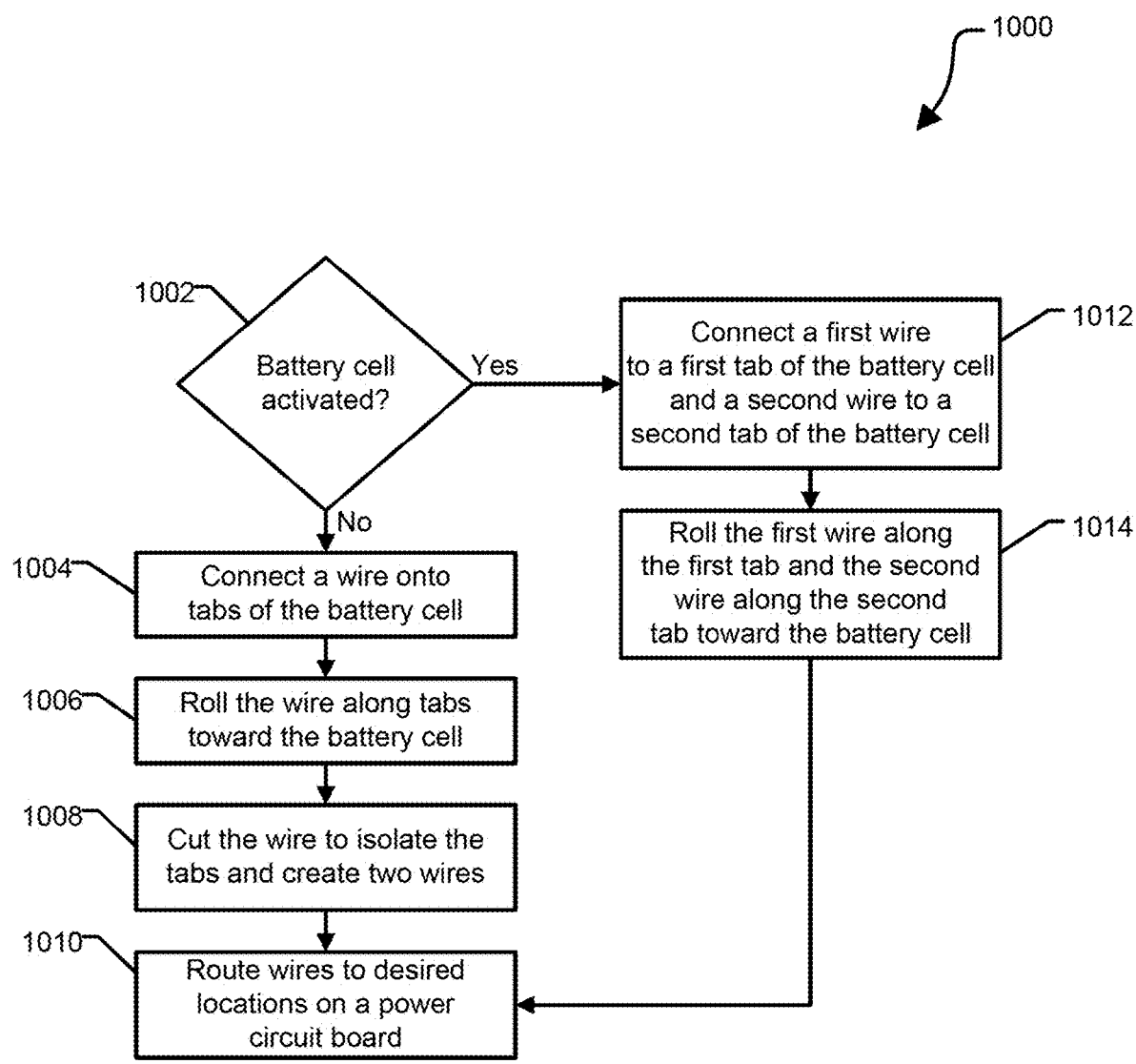
FIG. 10 is a flow diagram of a method for providing a high current battery cell planar tab interconnect according to at least one embodiment of the present disclosure.

FIG. 10 illustrates a flow diagram of a method 1000 for providing a high current battery cell planar tab interconnect according to at least one embodiment of the present disclosure. At block 1002, a determination is made whether a battery cell is activated at block. In an embodiment, the battery cell is active when connecting power tabs of the battery cell to a circuit, a wire, or the like causes a current flow between the power tabs. If the battery cell is not activated, a wire is connected onto the power tabs of the battery cell at block 1004. In an embodiment, the wire can be connected to the power tabs, by the wire being spot welded to the power tabs. In an embodiment, the wire can be a single strand wire or a multiple strand wire, and the gauge of the wire can be selected based on a power circuit board connection for the wire. In an embodiment, the wire can be more conductive than the power tabs.

At block 1006, the wire is rolled along the power tabs from distal ends of the power tabs to proximal ends of the power tabs until the length of the power tabs are substantially reduced. In an embodiment, the power tabs can be pliable, such that the power tabs can be easily bent without breaking. The wire can be cut at block 1008. In an embodiment, the cutting of the wire can separate a middle portion of the wire located in between the power tabs from the outer two portions of the wire. The removal of the middle portion of the wire can isolated the power tabs from each other. At block 1010, the wires can be routed to desired locations on a power circuit board.

If at block 1002, the battery cell is activated, one wire is connected to one of the power tabs and another wire is connected to the other power tab at block 1012. In an embodiment, the wires can be connected to the power tabs, by each of the wires being spot welded to their respective power tab. At block 1014, each of the wires is rolled along its respective power tab from a distal end of the power tab to a proximal end of the power tab until the length of the power tab is substantially reduced, and the flow continues as stated above at block 1010.

Figure 11:
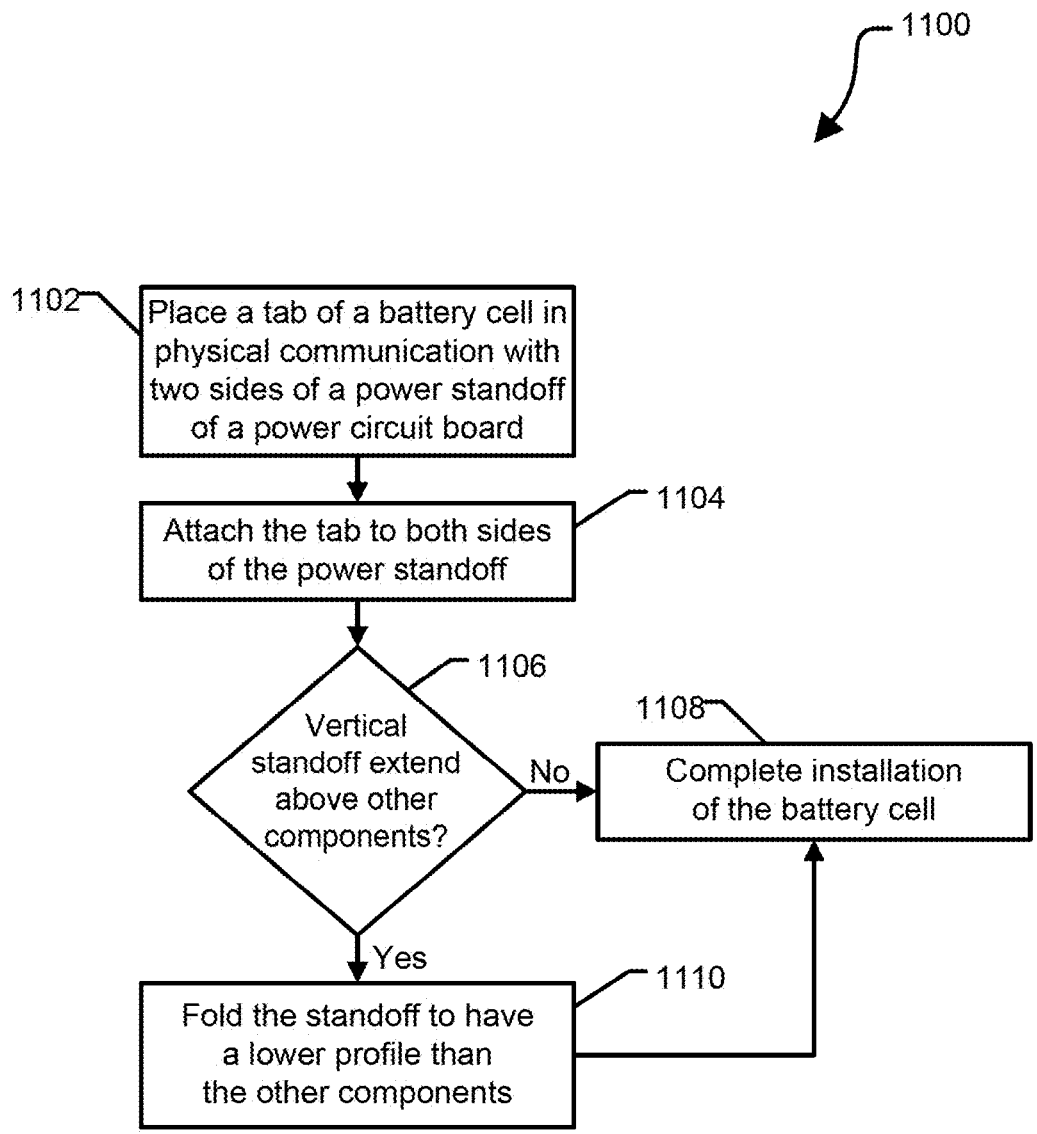
FIG. 11 is a flow diagram of another method for providing a high current battery cell planar tab interconnect according to at least one embodiment of the present disclosure.

FIG. 11 illustrates a flow diagram of a method 1100 for providing a high current battery cell planar tab interconnect according to at least one embodiment of the present disclosure. At block 1102, a power tab of a battery cell is placed in physical communication with two sides of a power standoff of a power circuit board of an information handling system 100. In an embodiment, the power tab can be pliable, such that the power tab can be easily bent without breaking. In an embodiment, the power tab can be placed in physical communication with a vertical extension portion of the power standoff.

At block 1104, the power tab is attached to both sides of the power standoff. In an embodiment, the power tab can be attached to the power standoff by being spot welded to both sides of the vertical extension of the power standoff. At block 1106, a determination is made whether the vertical extension portion of the power standoff extends above the other components of the power circuit board and/or the battery cell. If the vertical extension portion of the power standoff does not extend above the other components, the installation of the battery cell is completed at block 1108. If the vertical extension portion of the power standoff does extend above the other components, the vertical extension portion of the power standoff is folded or bent to have a lower profile than the other components at block 1110, and the battery cell installation is completed at block 1108.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
   a battery cell including a first power tab having a proximal end connected to the battery cell and a distal end, the first power tab to provide a first output terminal for the battery cell; and
   a power circuit board including a power standoff having:
   a base connected to the power circuit board; and
   a vertical extension portion connected to the base, the vertical extension portion having first and second surfaces that are located on opposite sides of the vertical extension portion, the first and second surfaces both in physical communication with the first power tab, wherein the first power tab is pliable to bend over a third surface of the vertical extension portion and be in physical communication with both the first and second surfaces of the vertical extension portion.

2. The information handling system of claim 1, wherein the battery cell further includes:
   a second power tab including a proximal end connected to the battery cell and a distal end, the second power tab to provide a second output terminal for the battery cell.

3. The information handling system of claim 1, wherein the base provides power from the battery cell to the power circuit board.

4. The information handling system of claim 1, wherein the first power tab is connected to the power standoff by being spot welded to the first and second surfaces of the vertical extension portion.

5. The information handling system of claim 1, wherein a height of the power standoff is reduced in response to the vertical extension portion being bent over at a predetermined height.

* * * * *